(12) United States Patent  (10) Patent No.: US 6,281,111 B1
Ohsumi  (45) Date of Patent: Aug. 28, 2001

(54) SEMICONDUCTOR APPARATUS AND METHOD FOR FABRICATING THE SAME

(75) Inventor: Takashi Ohsumi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/580,624

(22) Filed: May 30, 2000

Related U.S. Application Data

(62) Division of application No. 08/959,667, filed on Oct. 29, 1997, now Pat. No. 6,097,091.

(30) Foreign Application Priority Data

May 19, 1997 (JP) .................................................. 9-128176

(51) Int. Cl.[7] .............................................. H01L 21/4763
(52) U.S. Cl. ........................ 438/623; 438/612; 438/613; 438/622; 438/634
(58) Field of Search .................................... 438/612, 613, 438/622, 623, 634

(56) References Cited

U.S. PATENT DOCUMENTS

| 4,654,113 | * | 3/1987 | Tuchiya et al. | 156/643 |
| 5,382,544 | * | 1/1995 | Matsumoto et al. | 437/195 |
| 6,051,489 | * | 4/2000 | Young et al. | 438/612 |
| 6,136,624 | * | 10/2000 | Kemmochi et al. | 438/30 |

* cited by examiner

Primary Examiner—Eddie Lee
Assistant Examiner—N. Drew Richards
(74) Attorney, Agent, or Firm—Jones Volentine, P.L.L.C

(57) ABSTRACT

A semiconductor apparatus includes a semiconductor integrated circuit including a conductive pattern; an insulating layer which is formed on the semiconductor integrated circuit to forms a plurality of base members having uneven heights; an opening which is formed through the insulating layer to expose a part of the conductive pattern; and a conductive layer which is formed on the insulating layer and the opening, the conductive layer is extending from the exposed portion of the conductive pattern to the top surface of the highest base member. An electrode is composed of the insulating layer, the opening and the conductive layer.

18 Claims, 16 Drawing Sheets

SEMICONDUCTOR APPARATUS AND METHOD FOR FABRICATING THE SAME

This is a divisional application of application Ser. No. 08/959,667, filed Oct. 29, 1997, now U.S. Pat. No. 6,097,091, which is hereby incorporated by reference in its entirety.

CROSS REFERENCE TO RELATED APPLICATION

This application claims the priority of Application No. H09-128176, filed May 19, 1997 in Japan, the subject matter of which is incorporated herein by reference.

TECHNICAL FIELD OF THE INVENTION

The present invention relates to a semiconductor apparatus and a method for fabricating the same, and more particularly to an electrode structure of a semiconductor integrated circuit and a method for fabricating the same. The invention further relates to a method and a structure for mounting a semiconductor substrate.

BACKGROUND OF THE INVENTION

Conventionally, for mounting process of a semiconductor integrated circuit to a connection substrate, a tape carrier package structure, a chip on board structure and a chip on glass structure have been used. According to those structures, the space between the semiconductor substrate and the connection substrate are filled with a seal resin. For an electrode structure in such a mounting structure, a bump bonding structure using a bump electrode has been used. The bump electrode may be a metal bump electrode, such as a gold (Au) bump electrode, a solder electrode made of an alloy of lead (Pb) and tin (Sn), and the like.

Such a metal bump electrode is deformed plastically, and the alloy of Pb—Sn may be broken from its crystal surface. The difference of the thermal expansion coefficients between the semiconductor substrate and the connection substrate makes some thermal stress in the electrode. Such thermal stress can be also made by the difference of the thermal expansion coefficients between the seal resin and the bump electrode itself. The thermal stress makes thermal fatigue in the electrode, and therefore the electrode may be broken in some cases. The semiconductor integrated circuit is metal-plated, then the metal plate is etched to form the bump electrode. In the semiconductor substrate, a region which is uncovered with a protection layer, such as a trimming circuit, may be seriously affected by the plating process and etching process. Such a conventional electrode structure does not have high enough reliability of electrical connection, because the surface of the semiconductor integrated circuit is not enough protected.

OBJECTS OF THE INVENTION

Accordingly, an object of the invention is to provide a semiconductor apparatus and a method for fabricating the same, in which an electrode has a high reliability of electrical connection.

Another object of the invention is to provide a semiconductor apparatus and a method for fabricating the same, in which the surface of the semiconductor integrated circuit can be protected sufficiently after an electrode is formed.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a semiconductor apparatus includes a semiconductor integrated circuit including a conductive pattern; an insulating layer which is formed on the semiconductor integrated circuit to forms a plurality of base members having uneven heights; an opening which is formed through the insulating layer to expose a part of the conductive pattern; and a conductive layer which is formed on the insulating layer and the opening, the conductive layer is extending from the exposed portion of the conductive pattern to the top surface of the highest base member. An electrode is composed of the insulating layer, the opening and the conductive layer.

According to a second aspect of the invention, a semiconductor apparatus includes a semiconductor substrate including a semiconductor integrated circuit, and an electrode, which is composed of a base member of insulating material formed on the semiconductor integrated circuit and a conductive layer formed on the surface of the base member; a connection substrate on which the semiconductor substrate is mounted with a face-down technique; and a seal member which is filled in the space between the semiconductor substrate and the connection substrate. The base member and the seal member are made of the same material.

According to a third aspect of the invention, in a method for fabricating a semiconductor apparatus, an insulating layer is formed on a semiconductor integrated circuit. Then, an opening is formed through the insulating layer to expose a part of a conductive pattern. A conductive layer is formed over the insulating layer with the opening; the conductive layer is patterned except a portion extending from the exposed part of the conductive pattern to a predetermined portion of the insulating layer; and the insulating layer is shaped at the portion uncovered with the conductive layer to have a height lower than the portion covered with the conductive layer.

According to a fourth aspect of the invention, in a method for fabricating a semiconductor apparatus, a semiconductor substrate is fabricated to include a semiconductor integrated circuit, and an electrode, which is composed of a base member of insulating material formed on the semiconductor integrated circuit and a conductive layer formed on the surface of the base member. The semiconductor substrate is placed to be face-down to a connection substrate; then the electrode is connected to the connection substrate. Nest, a seal member is filled in the space between the semiconductor substrate and the connection substrate. The base member and the seal member are made of the same material.

According to the first and third aspects of the invention, the semiconductor integrated circuit is protected by the base members. Further, the electrode is prevented from being broken due to a thermal stress and thermal fatigue, because the electrode to be connected to another substrate is formed on the top surface of the highest (tallest) base member. As a result, the semiconductor apparatus can be fabricated to have a high reliability.

According to the second and fourth aspects of the invention, the space between the semiconductor substrate and the connection substrate is filled with the seal member that is made of the same material of the base member, so that the base member and the seal member have the same thermal expansion coefficient. As a result, the electrode is prevented from being broken due to a thermal stress and thermal fatigue, and therefore, the semiconductor apparatus can be fabricated to have a high reliability.

DETAILED DISCLOSURE OF THE INVENTION

[First Preferred Embodiment]

Figure 1A:
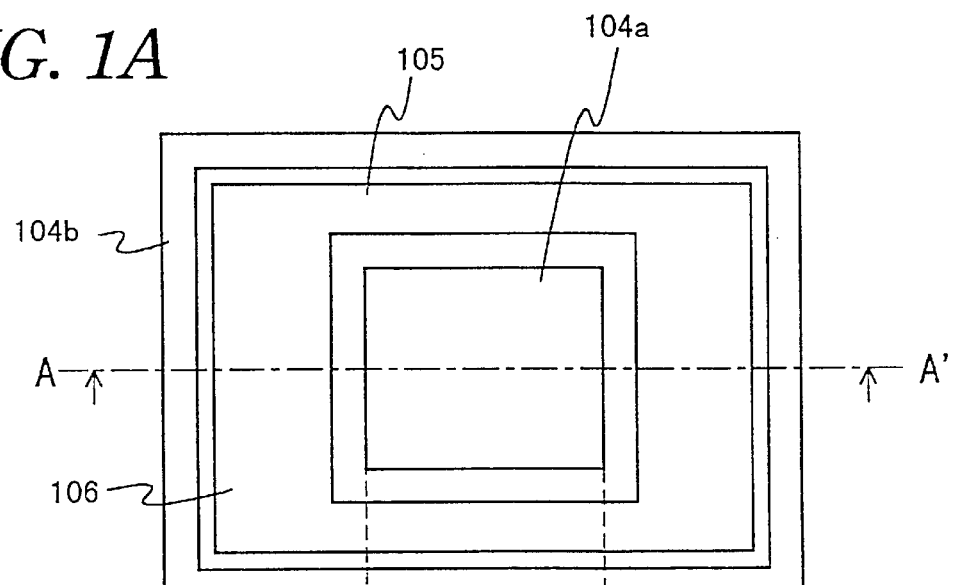
FIG. 1A is a plan view showing an electrode structure of a semiconductor apparatus, according to a first preferred embodiment of the invention.
Figure 1B:
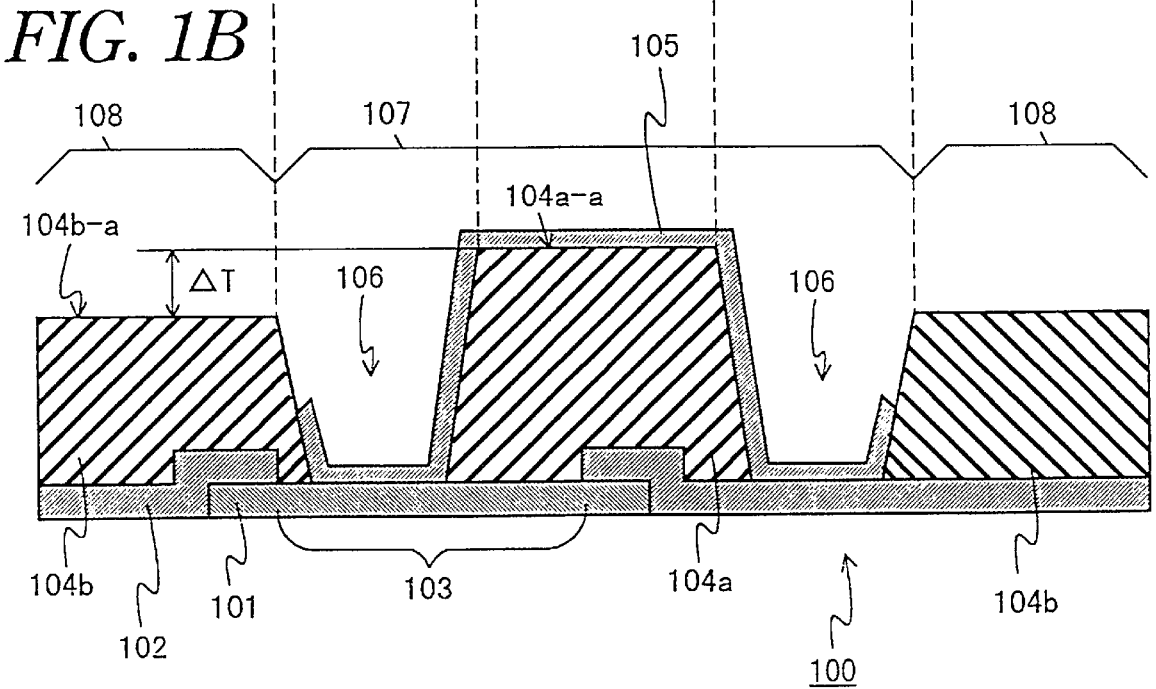
FIG. 1B is a cross-sectional view taken on line A–A' of FIG. 1A.

FIGS. 1A and 1B show an electrode structure of a semiconductor apparatus according to a first preferred embodiment of the invention. A conductive pattern 101 and a surface protection layer 102 are first formed on a semiconductor-integrated-circuit substrate 100, which is a silicon wafer, to provide a semiconductor integrated circuit. The semiconductor-integrated-circuit substrate 100 is hereinafter called "semiconductor substrate 100." A reference number 103 shows a traction portion of the conductive pattern 101. The conductive pattern 101 is made of aluminum (Al) or an alloy of aluminum (Al) and silicon (Si), copper (Cu) or the like. The surface protection layer 102 is formed to cover the surface of the semiconductor integrated circuit for protection. The surface protection layer 102 is made of silicon oxide ($SiO_2$), silicon chloride ($Si_xN_y$), or the like. The traction portion 103 may be located on a pad of the conductive pattern, such as a bonding pad, or at via-hole (not shown).

On the semiconductor integrated circuit, a plurality of base members 104a and 104b are formed to have the different heights. These base members 104a and 104b are made of insulating material, such as polyimide resin. An conductive layer 105 is formed on the semiconductor integrated circuit. An opening 106 is formed around the higher (taller) base member 104a. The base members 104a and 104b, the conductive layer 105 and the opening 106 compose an electrode of the semiconductor integrated circuit. The top surface 104b-a of the lower (shorter) base member 104b is designed to be "ΔT" lower in position than the top surface 104a-a of the base member 104a. The shape of the top surface 104a-a is not limited by square.

The opening 106 is formed between the higher base member 104a and lower base member 104b over the traction portion 103 to expose the conductive pattern 101. As shown in FIGS. 1A and 1B, the opening 106 is formed to surround the higher base member 104a and to separate the base members 104a and 104b from each other. The opening 106 can be designed not to surround the base member 104a, as long as it exposes the conductive pattern 101. The base members 104a and 104b can be designed not to be separated from each other, as long as those have the different heights.

The conductive layer 105 is formed over the base member 104a, the conductive pattern 101 and the surface protection layer 102 to make a connection terminal of the conductive pattern 101 at the top of the higher base member 104a. In FIGS. 1A and 1B, although the conductive layer 105 entirely covers the higher base member 104a, some regions on the surface of the base member 104 can be uncovered with the conductive layer 105. The conductive layer 105 is of metal or an alloy, which is selected with consideration of a connecting process to a connection substrate (300, 301). The conductive layer 105 may be designed to have a single layer structure or multi-layered structure. For example, the conductive layer 105 may be designed to have a single layer structure of gold (Au), copper (Cu), an alloy of lead (Pb) and tin (Sn), and the like; or to have a double-layered structure of gold (Au) and nickel (Ni), hereinafter indicated by Ni/Au layer, or of gold (Au), titan Ti) and tungsten (W), hereinafter indicated by Ti-W/Au layer.

The higher base member 104a, the conductive layer 105 and the opening 106 forms an electrode section 107. The lower base member 104b forms a surface protecting section 108, which protects the surface of the semiconductor integrated circuit. The lower base members 104b can be designed to have the different heights from each other, as long as the higher base member 104a is the highest. In other words, there can be more than three different heights of base members including the highest base member.

Figure 2A:
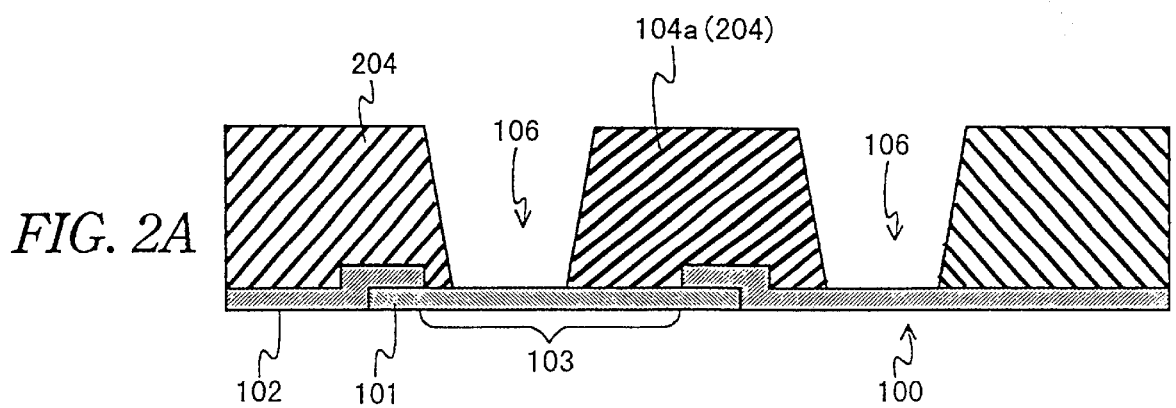
FIGS. 2A to 2D are cross-sectional views showing steps for fabricating the electrode structure shown in FIGS. 1A and 1B.

Now, the fabrication steps of the electrode structure shown in FIGS. 1A and 1B are described in conjunction with FIGS. 2A to 2D. Referring to FIG. 2A, the conductive pattern 101, the surface protection layer 102 are formed on the semiconductor substrate 100. Then, an insulating layer 204, which is of hardenable polyimide resin, is coated on the entire structure using a spin coating technique. Next, the opening 106 is formed through the insulating layer 204 to expose the conductive pattern 101 and to shape the higher base member 104a. After that, the insulating layer 204 is baked at 350° C. to be hardened.

Figure 2B:
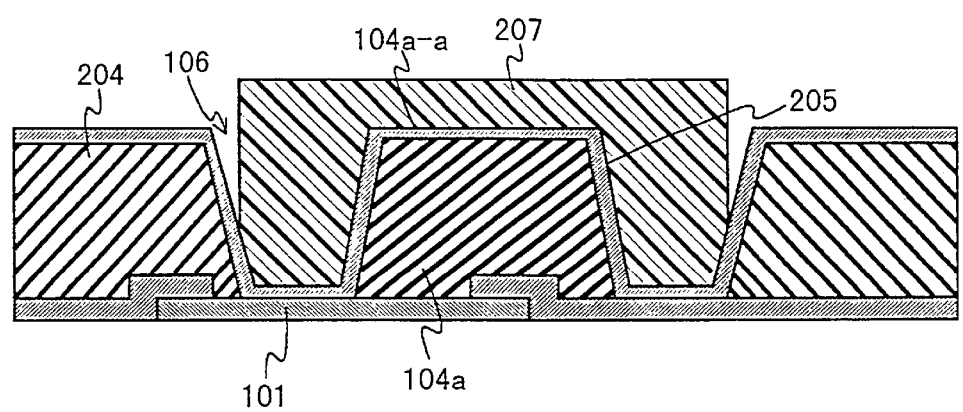
Figure 2C:
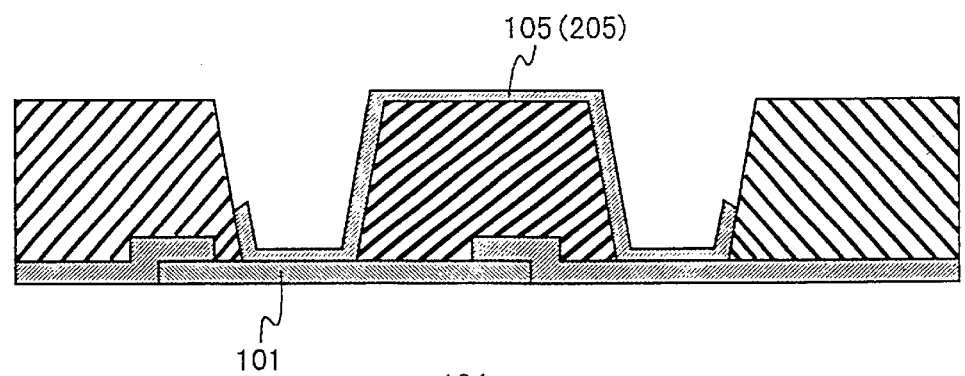

Referring now to FIGS. 2B and 2C, the conductive layer 205 is formed over the insulating layer 204, which is provided with the opening 106. The conductive layer 205 is patterned to remove unnecessary portions, so that the conductive pattern 105 is formed on an area extending from the conductive pattern 101 to the top surface 104a-a of the higher base member 104a. In more detail, the conductive layer 205 of copper is formed over the insulating layer 204 by spattering technique, and a photo-resist 207 is patterned on the conductive layer 205. Then, the conductive layer 205 is patterned by wet-etching technique using the photo-resist 207 as an etching mask.

Figure 2D:
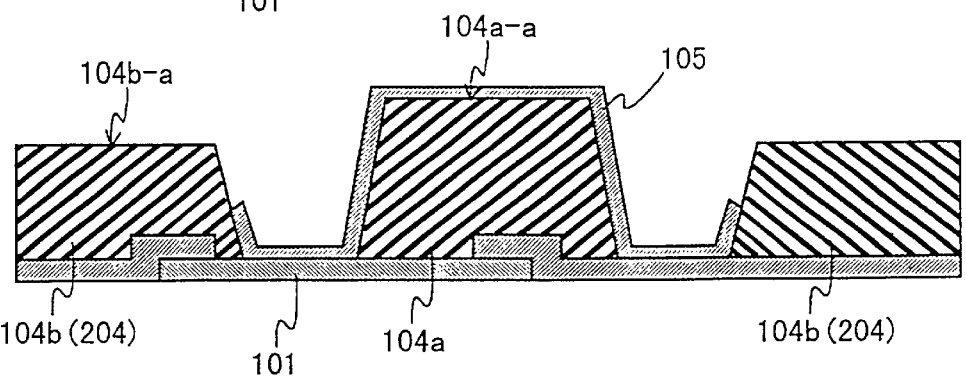

Next, referring to FIG. 2D, the insulating layer 204 is shaved at portions that is not covered with the conductive layer 105 (205) to form the lower base members 104b. As a result, the electrode is formed on the semiconductor substrate 100, shown in FIGS. 1A and 1B. Thus fabricated semiconductor substrate 100 is mounted to the connection substrate. In FIGS. 1A and 1B, the conductive pattern 105 located at the top surface 104a-a of the higher base member 104a is to be connected to the connection substrate. The lower base member 104b is not connected to the connection substrate. The space between the lower base member 104b and the connection substrate may be filled with a seal resin.

Figure 3A:
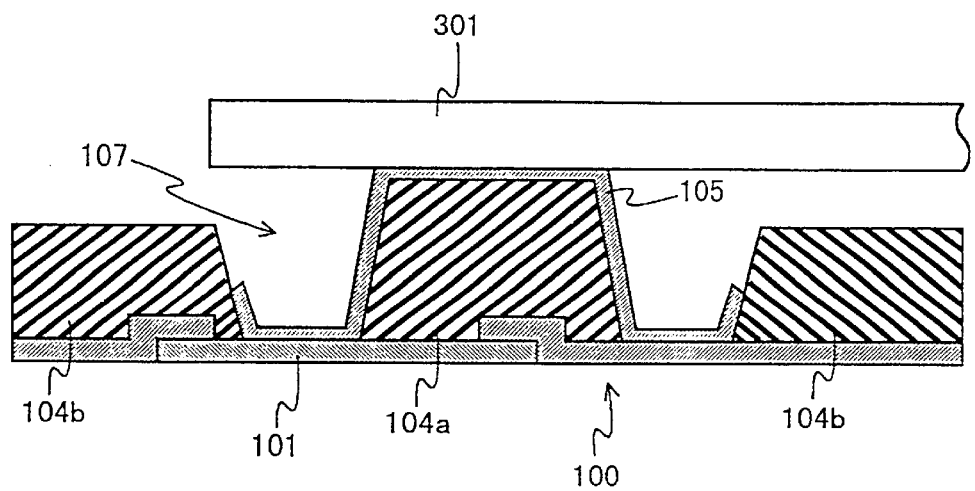
FIG. 3A is a cross-sectional view showing the positional relation between the electrode structure of the first preferred embodiment and a lead of a connection substrate.
Figure 3B:
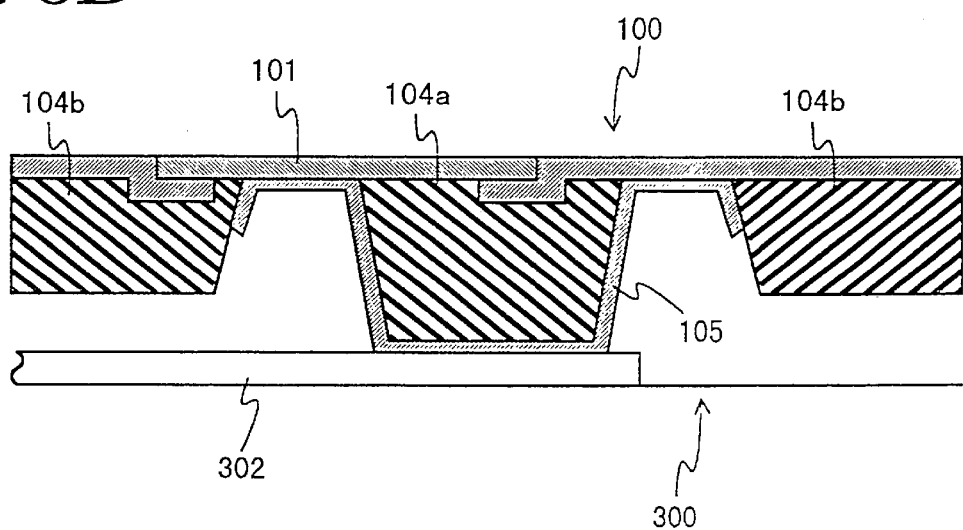
FIG. 3B is a cross-sectional view showing the positional relation between the electrode structure of the first preferred embodiment and a conductive wire of a connection substrate.

FIG. 3A shows the positional relation between the electrode structure of the first preferred embodiment and a lead 301 of a connection substrate, such as a tape carrier. FIG. 3B shows the positional relation between the electrode structure of the first preferred embodiment and a conductive wire 302 of a connection substrate 300. In FIG. 3A, the conductive layer 105 is bonded to the lead 301 by a thermal-compression bonding technique. In FIG. 3B, the conductive layer 105 is bonded to the conductive wire 302 by a reflow technique.

According to the above described first preferred embodiment, the semiconductor integrated circuit is covered entirely with the base members 104a and 104b, which are made of insulating material, so that the surface of the semiconductor integrated circuit is enough protected when the electrode is fabricated and when the bonding process is performed, especially at an area where the surface protection layer 102 is not formed. The top surface 104a-a of the higher base member 104b is designed to be AT higher than that of the lower base member 104b, so that the conductive layer 105 at the top surface 104a-a can be bonded to the connection substrate easily.

The base member 104a is made of polyimide resin, which has a polymeric structure having an elastic limit higher than metal, so that the electrode section 107 is not plastically deformed, just elastically deformed in response to stress or thermal stress generated in the bonding process. As a result, the electrode is prevented from being broken due to thermal fatigue, and therefore, the reliability of the electrode improves.

The conductive layer 105 to be bonded is apart from the conductive pattern 101 by the height of the base member 104a, so that the electrode can be prevented from deterioration due to metal diffusion at the connected face between the conductive layer 105 and the conductive pattern 101 even if the electrode is bonded by thermal-compression technique. As a result, an extra metal layer for preventing metal diffusion, which is required for a bump electrode, can be omitted in this embodiment. The base member 104a can be formed not only over the traction portion 103 but also over the surface protection layer 102, therefore, the top surface 104a-a of the base member 104 can be freely designed in size and shape independently from the size and shape of the traction portion 103.

[Second Preferred Embodiment]

Figure 4A:
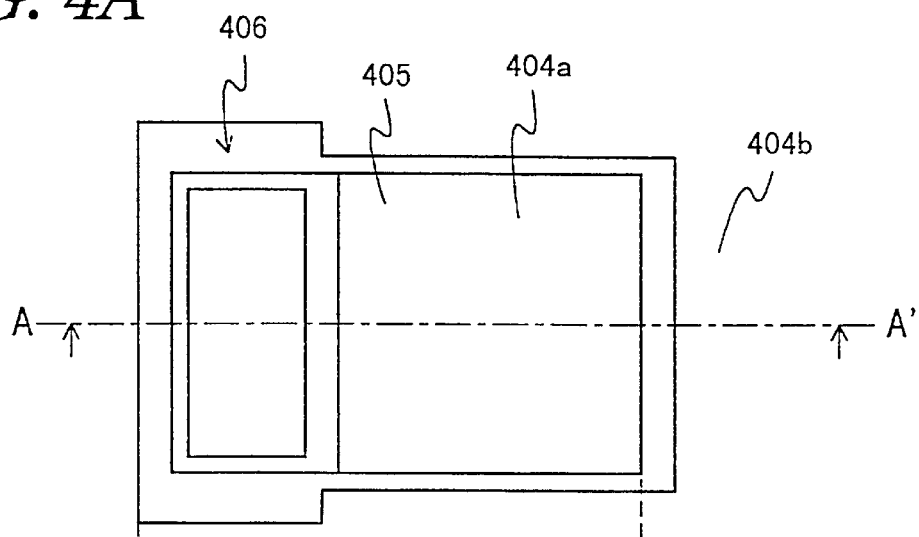
FIG. 4A is a plan view showing an electrode structure of a semiconductor apparatus, according to a second preferred embodiment of the invention.
Figure 4B:
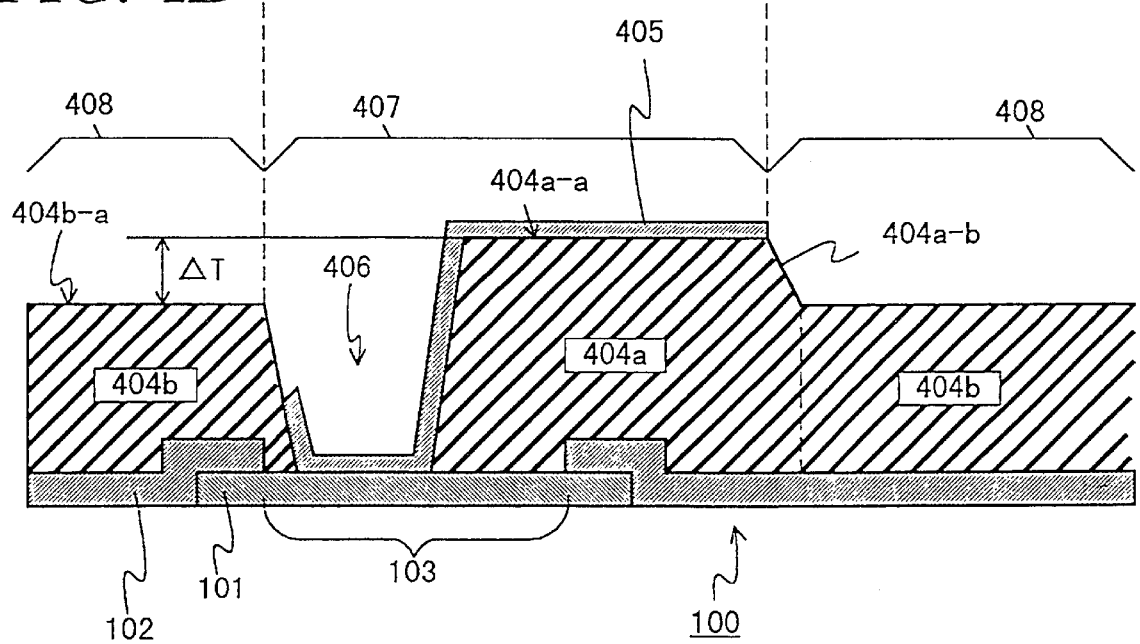
FIG. 4B is a cross-sectional view taken on line A–A' of FIG. 4A.

FIGS. 4A and 4B show an electrode structure of a semiconductor apparatus according to a second preferred embodiment of the invention. In those figures, the same or corresponding components to those in the first preferred embodiment are represented by the same reference numbers, and the same description is not repeated for avoiding redundant description. In the second preferred embodiment, a higher base member 404a and lower base members 404b are formed on a semiconductor substrate 100 so that the higher base member 404a is ΔT higher than the lower base members 104b. An opening 406 is formed through the higher base member 404a and the lower base member 404b. A conductive layer 405 is formed over the semiconductor integrated circuit to extend from a conductive pattern 101 to the top surface 404a-a of the higher base member 404a. The higher and lower base members 404a and 404b are made of polyimide resin. The conductive layer 405 is made of the same material as the conductive layer 105, shown in FIGS. 1A and 1B.

As shown in FIG. 4B, the higher base member 404a and lower base member 404b are formed in one united body, which is one feature of the embodiment. Another feature of the embodiment is that the conductive layer 405 is not formed over the base members 404a and 404b entirely. In more detail, the conductive layer 405 is not formed on the top surface of the lower base member 404b nor on the side surface 404a-b of the higher base member 404a. The opening 406 is designed not to surround the higher base member 404a, in contrast the opening 106 of the first preferred embodiment is surrounding the higher base member 104a. The higher base member 404a, the conductive layer 405 and the opening compose an electrode section 407. The lower base member 404b composes a surface protecting section 408, which protects the surface of the semiconductor substrate 100.

Figure 5A:
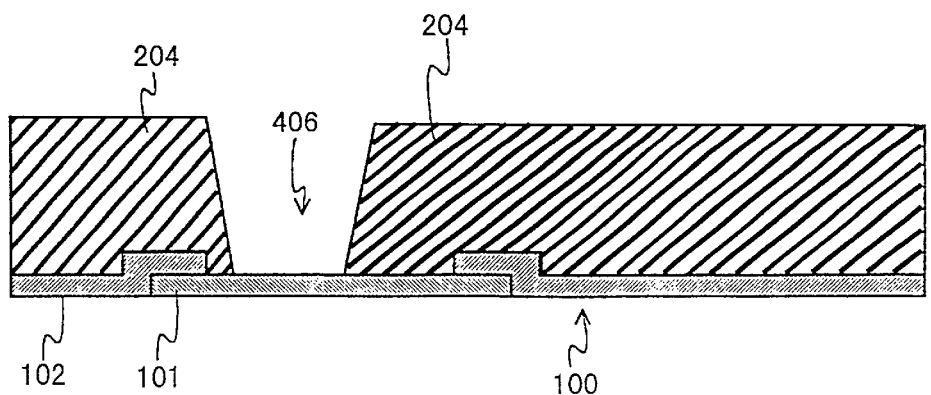
FIGS. 5A to 5D are cross-sectional views showing steps for fabricating the electrode structure shown in FIGS. 4A and 4B.

Now, the fabrication steps of the electrode structure shown in FIGS. 4A and 4B are described in conjunction with FIGS. 5A to 5D. Referring to FIG. 5A, the conductive pattern 101, the surface protection layer 102 are formed on the semiconductor substrate 100. Then, an insulating layer 204, which is of hardenable polyimide resin, is coated over the entire structure. Next, the opening 406 is formed through the insulating layer 204 to expose the conductive pattern 101 and to shape a part of the higher base member 404a.

Figure 5B:
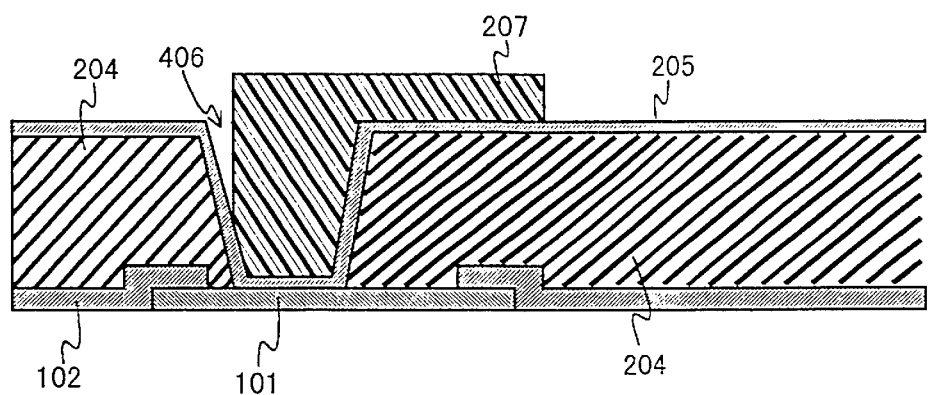
Figure 5C:
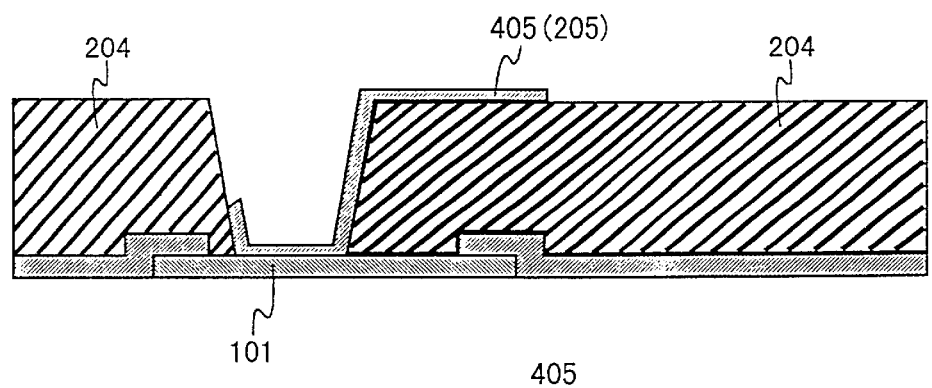

Referring now to FIGS. 5B and 5C, the conductive layer 205 is formed over the insulating layer 204 and the conductive pattern 101 at the bottom of the opening 406. The conductive layer 205 is patterned to remove unnecessary portions, so that the conductive pattern 405 is formed on an area extending from the conductive pattern 101 to the top surface 404a-a of the higher base member 404a. In more detail, the conductive layer 205 of copper is formed over the insulating layer 204 by spattering technique, and a photo-resist 207 is patterned on the conductive layer 205. Then, the conductive layer 205 is patterned by wet-etching technique using the photo-resist 207 as an etching mask.

Figure 5D:
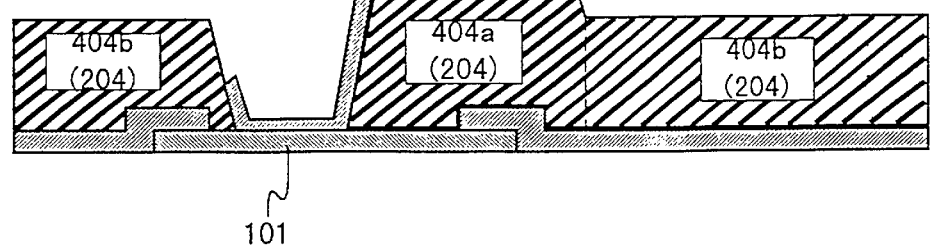

Next, referring to FIG. 5D, the insulating layer 204 is shaved at portions that is not covered with the conductive layer 405 (205) to complete the higher and lower base members 404a and 404b. As a result, the electrode is formed on the semiconductor substrate 100, shown in FIGS. 4A and 4B. Thus fabricated semiconductor substrate 100 is mounted to a connection substrate (300). In FIGS. 4A and 4B, the conductive pattern 405 located at the top surface 404a-a of the higher base member 404a is to be connected to the connection substrate. The space between the lower base member 404b and the connection substrate may be filled with a seal resin.

Figure 6A:
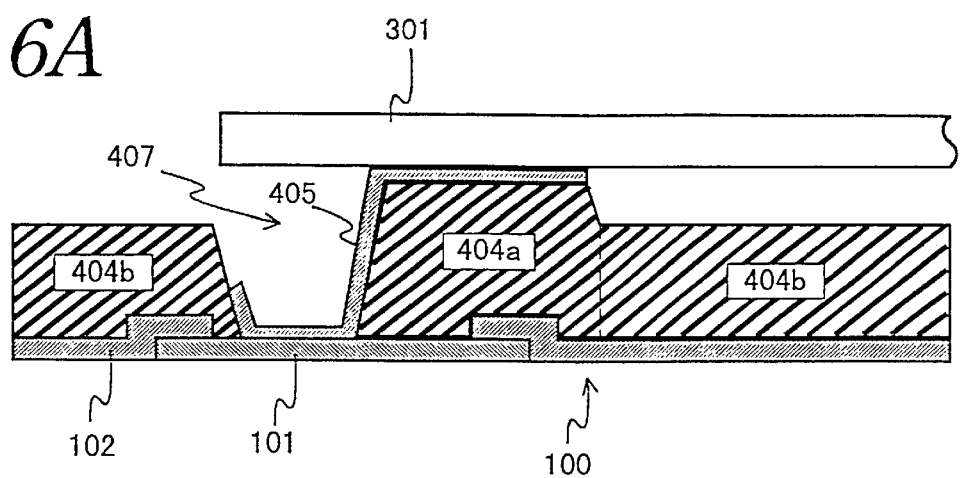
FIG. 6A is a cross-sectional view showing the positional relation between the electrode structure of the second preferred embodiment and a lead of a connection substrate.
Figure 6B:
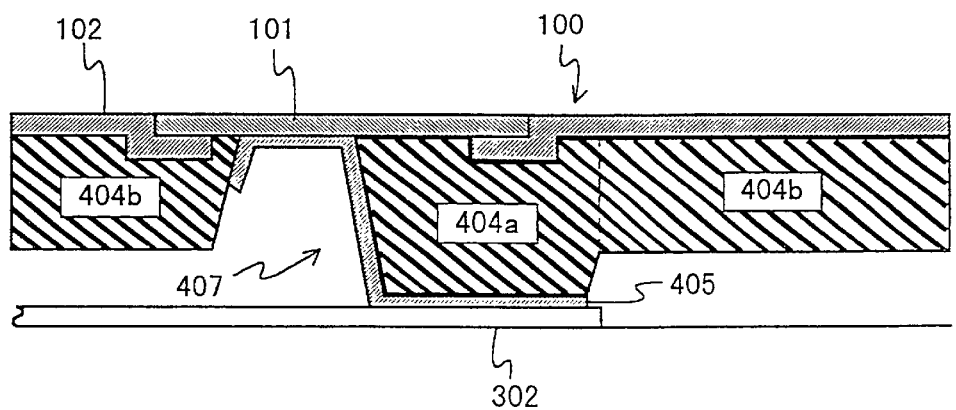
FIG. 6B is a cross-sectional view showing the positional relation between the electrode structure of the second preferred embodiment and a conductive wire of a connection substrate.

FIG. 6A shows the positional relation between the electrode structure of the second preferred embodiment and a lead 301 of a connection substrate, such as a tape carrier. FIG. 6B shows the positional relation between the electrode structure of the second preferred embodiment and a conductive wire 302 of a connection substrate 300. The conductive layer 405 is bonded to the lead 301 or the conductive wire 302 by thermal-compression bonding technique, reflow technique, or the like.

According to the above described second preferred embodiment, the higher and lower base members 404a and 404b are not covered with the conductive layer 405 entirely, so that a stress, generated due to elastic deformation in the bonding process, and a gas, generated in thermal processes for fabricating the electrode, can go off easily. As a result, the conductive layer 405 is not broken easily, and therefore, the electrode has a high connection reliability.

Even though the higher base member 404a is entirely covered with the conductive layer as shown in FIGS. 2A to 2D, the above mentioned advantage can be obtained. Further, even though the higher base member 104a is separated from the lower base member 104b as shown in FIGS. 1A and 1B, the above mentioned advantage can be obtained as long as the higher base members 104a is expose in part.

[Third Preferred Embodiment]

Figure 7:
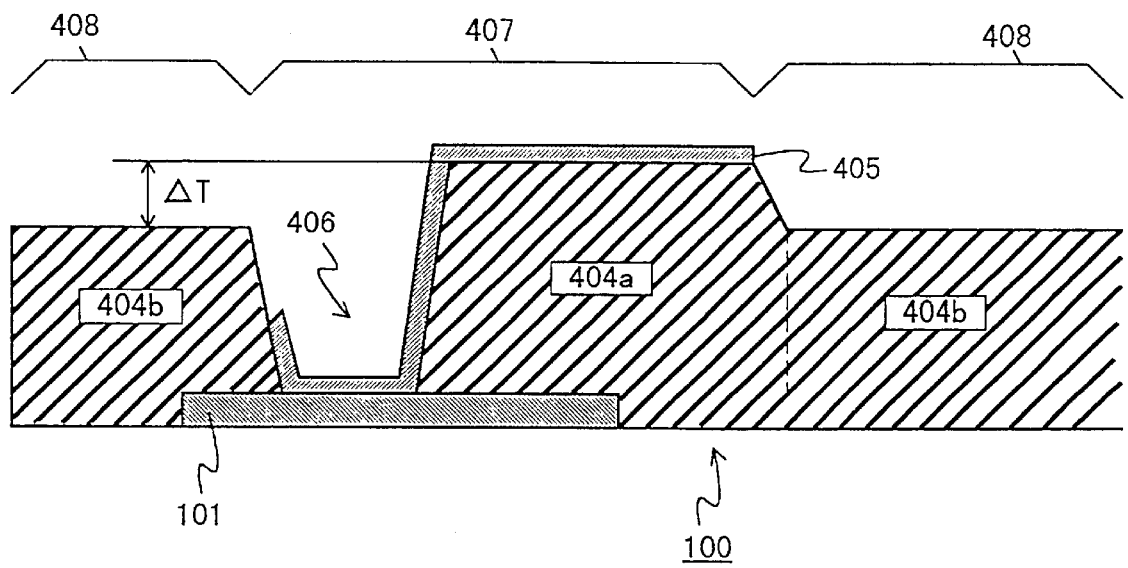
FIG. 7 is a cross-sectional view showing an electrode structure of a semiconductor apparatus, according to a third preferred embodiment of the invention.

FIG. 7 shows an electrode structure of a semiconductor apparatus according to a third preferred embodiment of the invention. In FIG. 7, the same or corresponding components to those in the first and second preferred embodiments are represented by the same reference numbers, and the same description is not repeated for avoiding redundant description. In the third preferred embodiment, a surface protection layer is not formed on a semiconductor substrate 100, instead base member 404b itself is functioning as a protection layer. That is the difference from the second preferred embodiment. An opening 406 is formed through the higher base member 404a and the lower base member 404b. A conductive layer 405 is formed over the semiconductor integrated circuit to extend from a conductive pattern 101 to the top surface of the higher base member 404a. The higher and lower base members 404a and 404b are made of polyimide resin. The conductive layer 405 is made of the same material as the conductive layer 105, shown in FIGS. 1A and 1B.

As shown in FIG. 7, the higher base member 404a and lower base member 404b are formed in one united body and the conductive layer 405 is not formed over the base members 404a and 404b entirely, in the same manner as the second preferred embodiment. The electrode is connected to a connection substrate in the same manner as the second preferred embodiment, shown in FIGS. 6A and 6B.

Figure 8A:
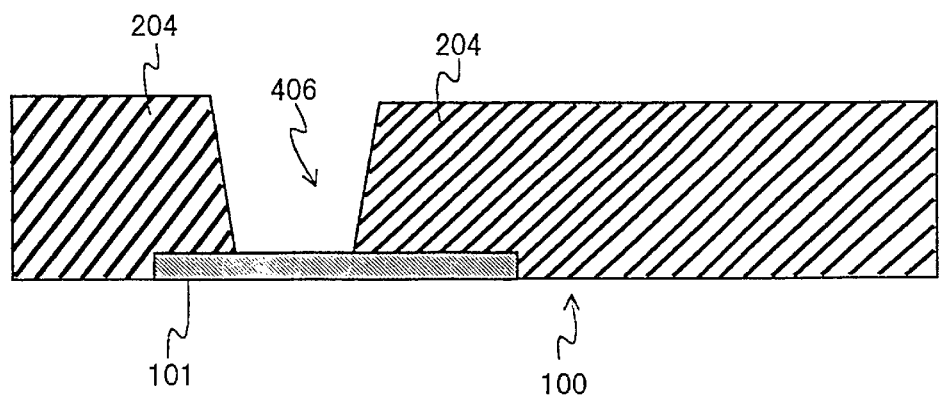
FIGS. 8A and 8B are cross-sectional views showing steps for fabricating the electrode structure shown in FIG. 7.
Figure 8B:
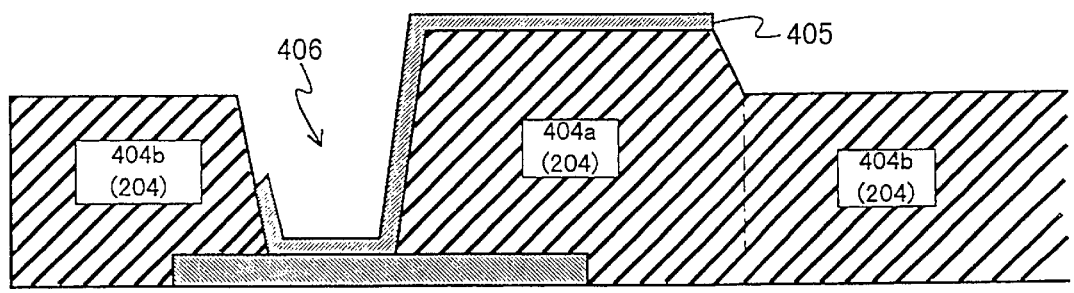

FIGS. 8A and 8B show steps for fabricating the electrode structure of the semiconductor apparatus shown in FIG. 7. In those figures, the same or corresponding components to those in the first and second preferred embodiments are represented by the same reference numbers, and the same description is not repeated for avoiding redundant description.

In fabrication, as shown in FIG. 8A, the conductive pattern 101 is first formed on the semiconductor substrate 100. Then, an insulating layer 204, which is of hardenable polyimide resin, is coated over the entire structure. Next, the opening 406 is formed through the insulating layer 204 to expose the conductive pattern 101 and to shape a part of the higher base member 404a. After the formation of the opening 406, the insulating layer 204 is hardened.

Next, the conductive layer 205 (not shown) is formed over the insulating layer 204 and the conductive pattern 101 at the bottom of the opening 406. The conductive layer 205 is patterned to remove unnecessary portions, so that the conductive pattern 405 is formed along an area extending from the conductive pattern 101 to the top surface of the higher base member 404a, as shown in FIG. 8B. In more detail, the conductive layer 205 of copper is formed over the insulating layer 204 by spattering technique, and a photo-resist (not shown) is patterned on the conductive layer 205. Then, the conductive layer 205 is patterned to form the conductive layer 405 by a wet-etching technique using the photo-resist as an etching mask. Substantially, the insulating layer 204 is shaved at portions that is not covered with the conductive layer 405 (205) to complete the higher and lower base members 404a and 404b. As a result, the electrode is formed on the semiconductor substrate 100, shown in FIG. 7. Thus fabricated semiconductor substrate 100 is mounted to a connection substrate (not shown). The conductive pattern 405 located at the top surface of the higher base member 404a is to be connected to the connection substrate. The space between the lower base member 404b and the connection substrate may be filled with a seal resin.

According to the above described third preferred embodiment, the insulating layer 204, especially the lower base member 404b, is functioning as a protection layer, so that the surface protection layer (102), used in the first and second preferred embodiments, can be omitted. As a result, the fabrication process of the semiconductor apparatus is simplified, and therefore, the cost of fabrication can be reduced.

[Fourth Preferred Embodiment]

Figure 9A:
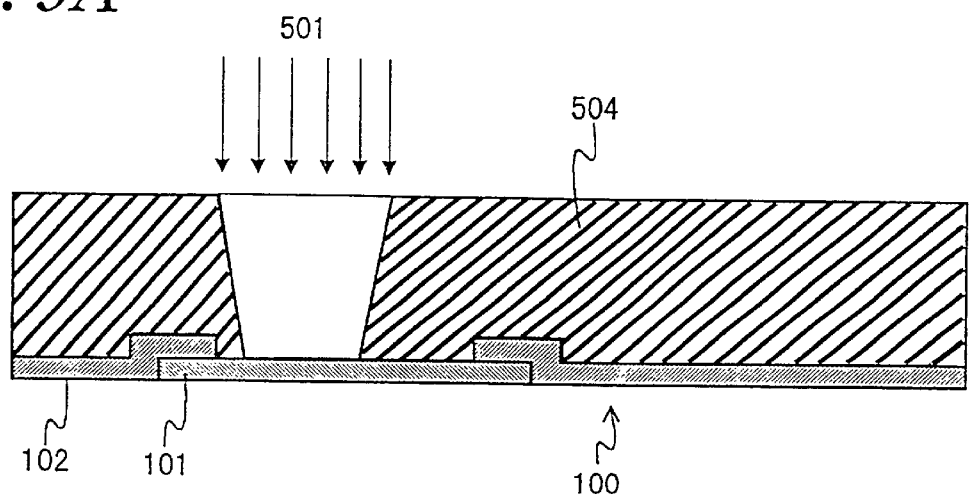
FIGS. 9A and 9B are cross-sectional views showing steps for fabricating an electrode structure of a semiconductor apparatus, according to a fourth preferred embodiment of the invention.
Figure 9B:
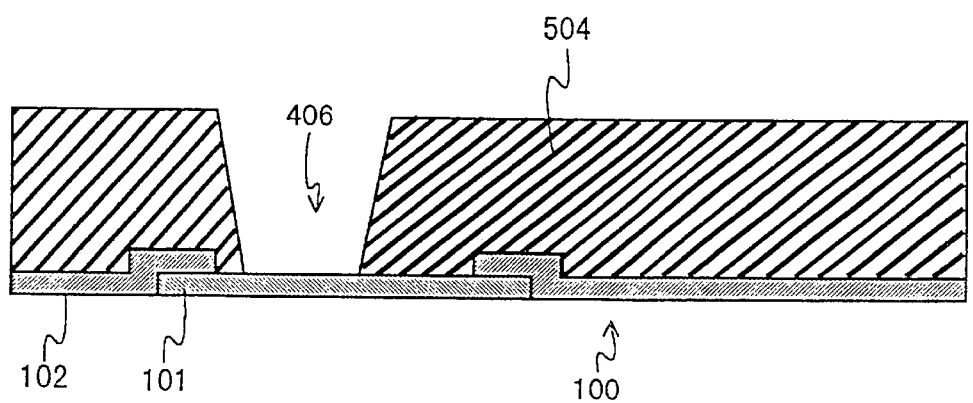

FIGS. 9A and 9B show steps for fabricating an electrode structure of a semiconductor apparatus, according to a fourth preferred embodiment of the invention. In those figures, the same or corresponding components to those in the first to third preferred embodiments are represented by the same reference numbers, and the same description is not repeated for avoiding redundant description. FIGS. 9A and 9B especially show the steps for forming an insulating layer 504 and an opening 406. The semiconductor apparatus of the fourth preferred embodiment is designed to have the same structure as the second preferred embodiment. The steps for fabricating the electrode of the fourth preferred embodiment is similar to those of the second preferred embodiment. In the fourth preferred embodiment, however, the insulating layer 504 is made of photo-sensitive resin, and the opening 406 is formed by lithographic technique.

In more detail, as shown in FIG. 9A, a conductive pattern 101 and a surface protection layer 102 are first formed on a semiconductor substrate 100. Then, the insulating layer 504, which is of photo-sensitive polyimide resin, is coated over the entire structure using a spin coating technique. Next, an exposure light 501 is applied to the insulating layer 504 at a region where the opening 406 is to be formed. The exposure light 501 includes a wavelength that is sensitive to the polyimide resin, which composes the insulating layer 504.

Next, the insulating layer 504 is dipped in a developer liquid to remove the exposed portion to form the opening 406, so that the conductive pattern 101 is exposed. The semiconductor substrate 100 (wafer) is baked at 350° C. to be hardened. After that, the steps shown in FIGS. 5B to 5D are performed. Thus fabricated semiconductor substrate 100 is mounted to a connection substrate (not shown).

According to the above described fourth preferred embodiment, the opening 406 is formed using the lithographic technique, so that the opening 406 can be shaped more precisely, finely and efficiently as compared to with a mechanical formation technique. The method for shaping the opening according to the fourth preferred embodiment is applicable to the first and third preferred embodiments.

[Fifth Preferred Embodiment]

Figure 10A:
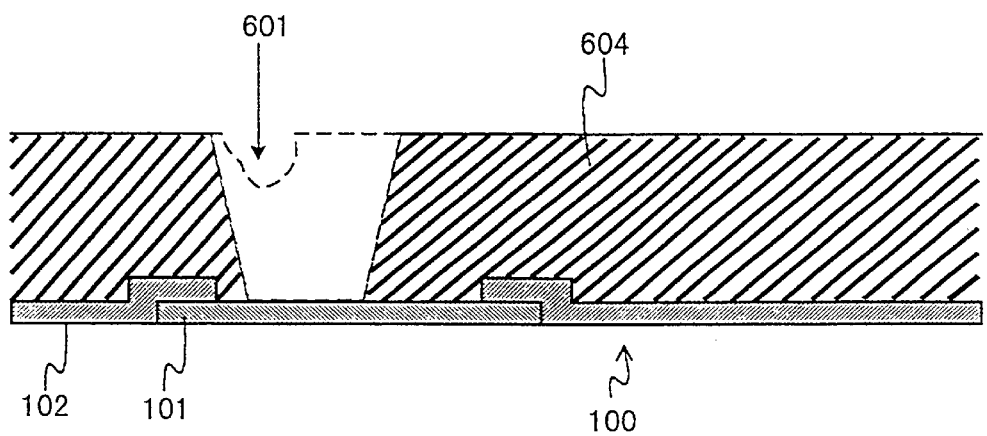
FIGS. 10A and 10B are cross-sectional views showing steps for fabricating an electrode structure of a semiconductor apparatus, according to a fifth preferred embodiment of the invention.
Figure 10B:
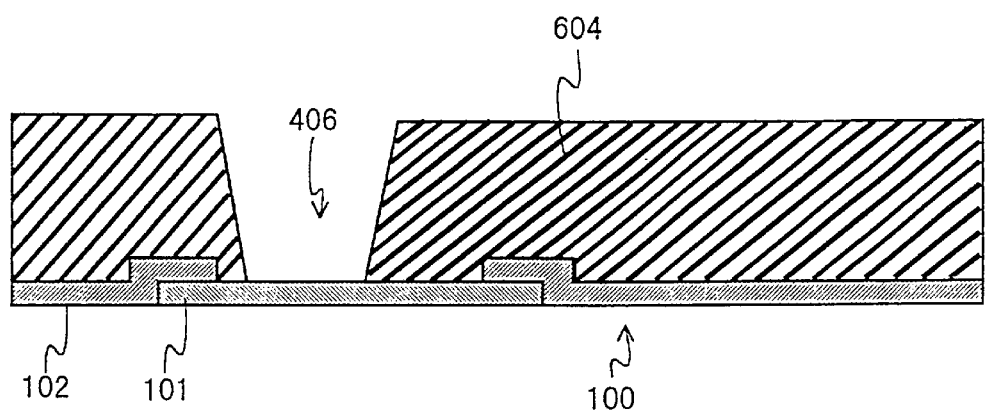

FIGS. 10A and 10B show steps for fabricating an electrode structure of a semiconductor apparatus, according to a fifth preferred embodiment of the invention. In those figures, the same or corresponding components to those in the first to fourth preferred embodiments are represented by the same reference numbers, and the same description is not repeated for avoiding redundant description. FIGS. 10A and 10B especially show the steps for forming an insulating layer 604 and an opening 406. The semiconductor apparatus of the fifth preferred embodiment is designed to have the same structure as the second preferred embodiment. The steps for fabricating the electrode of the fourth preferred embodiment is similar to those of the second preferred embodiment. In the fourth preferred embodiment, however, the opening 406 is formed by a laser machining technique, which is the feature of the embodiment.

As shown in FIG. 10A, a conductive pattern 101 and a surface protection layer 102 are first formed on a semiconductor substrate 100. Then, the insulating layer 604, which is of polyimide resin, is coated over the entire structure. Next, a laser beam 601 is applied to the insulating layer 604 to burn it off at a region where the opening 406 is to be formed, so that the opening is well shaped.

Next, a baking treatment of 350° C. is applied to the insulating layer 604, which is provided with the opening 406, to harden the insulating layer 604. After that, the steps shown in FIGS. 5B to 5D are performed. Thus fabricated semiconductor substrate 100 is mounted to a connection substrate (not shown).

According to the above described fifth preferred embodiment, the opening 406 is formed by the laser machining technique, so that the opening 406 can be shaped more precisely, finely and efficiently as compared to with a mechanical formation technique. The method for shaping the opening according to the fourth preferred embodiment is applicable to the first and third preferred embodiments.

[Sixth Preferred Embodiment]

Figure 11A:
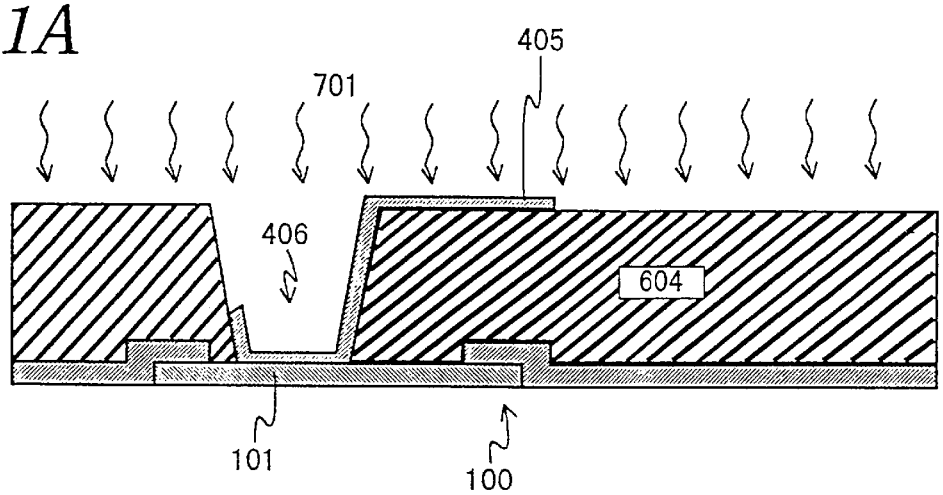
FIGS. 11A and 11B are cross-sectional views showing steps for fabricating an electrode structure of a semiconductor apparatus, according to a sixth preferred embodiment of the invention.
Figure 11B:
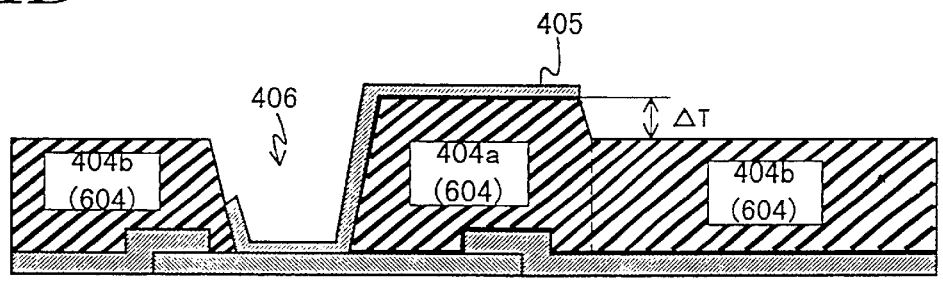

FIGS. 11A and 11B show steps for fabricating an electrode structure of a semiconductor apparatus, according to a sixth preferred embodiment of the invention. In those figures, the same or corresponding components to those in the first to fifth preferred embodiments are represented by the same reference numbers, and the same description is not repeated for avoiding redundant description. FIGS. 11A and 11B especially show the steps for cutting off a part of an insulating layer 604. The semiconductor apparatus of the sixth preferred embodiment is designed to have the same structure as the second preferred embodiment. The steps for fabricating the electrode of the fourth preferred embodiment is similar to those of the second preferred embodiment. In the fourth preferred embodiment, however, a part of the insulating layer 604 is cut of by a plasma-etching technique using a conductive layer 405 as an etching mask, which is the feature of the embodiment.

In fabrication, as shown in FIG. 11A, a conductive pattern 101 and a surface protection layer 102 are first formed on a semiconductor substrate 100. Then, the insulating layer 604, which is of polyimide resin, is coated over the entire structure, then the opening 406 is shaped. Next, the conductive layer 405 is formed on the conductive pattern 101 and a part of the insulating layer 604, as shown in FIG. 1A.

Referring now to FIG. 11B, a plasma etching process is performed to the semiconductor substrate 100, having the conductive layer 405, with an etching gas 701 mainly including oxygen ($O_2$) using the conductive layer 405 as an etching mask. By the etching process, the insulating layer 604 is selectively etched to form higher and lower base members 404a and 404b. In other words, the insulating layer 604 is etched by $\Delta T$ at regions where the lower base members 404b are to be formed, so that the lower base members 404b are shaped to have heights $\Delta T$ lower than that of the higher base member 404a. Thus fabricated semiconductor substrate 100 is mounted to a connection substrate (not shown).

According to the above described sixth preferred embodiment, the lower base members 404b are shaped by the plasma etching technique, so that the difference of height $\Delta T$ (depth of etching) between the higher and lower base members 404a and 404b can be precisely controlled.

[Seventh Preferred Embodiment]

Figure 12:
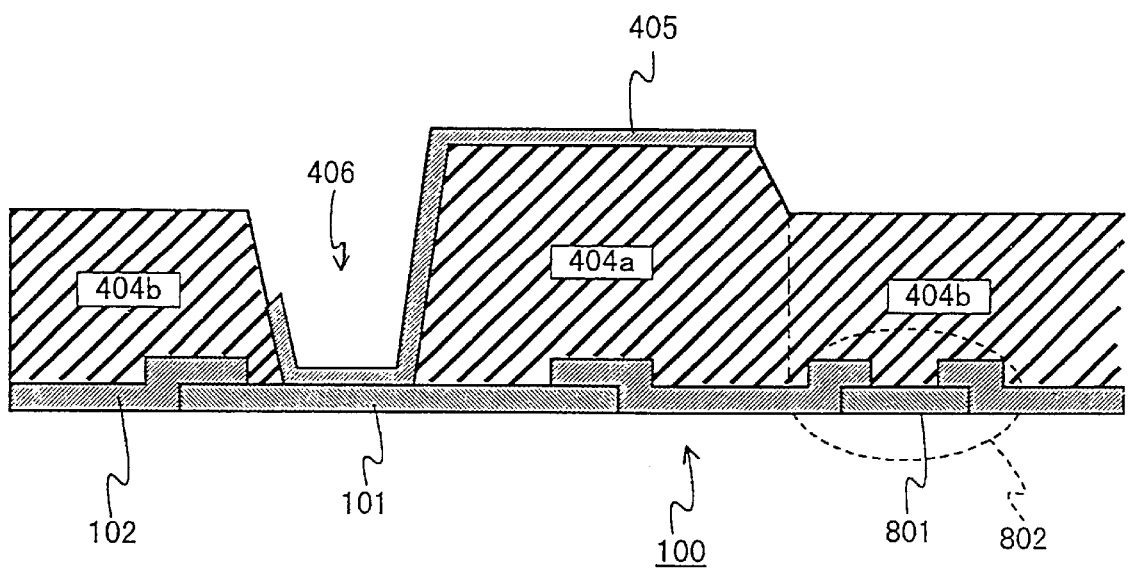
FIG. 12 is a cross-sectional view showing an electrode structure of a semiconductor apparatus, according to a seventh preferred embodiment of the invention.

FIG. 12 shows an electrode structure of a semiconductor apparatus according to a seventh preferred embodiment of the invention. In FIG. 12, the same or corresponding components to those in the first to sixth preferred embodiments are represented by the same reference numbers, and the same description is not repeated for avoiding redundant description. The steps for fabricating the electrode of the seventh preferred embodiment is similar to those of the second preferred embodiment. In the seventh preferred embodiment, however, a trimming process is performed before the steps of FIGS. 5A to 5D. The features of the embodiment are that an opening 406 is formed to expose a trimming pattern 801, and a trimming pad 802 is covered with an insulating layer 204.

Figure 13A:
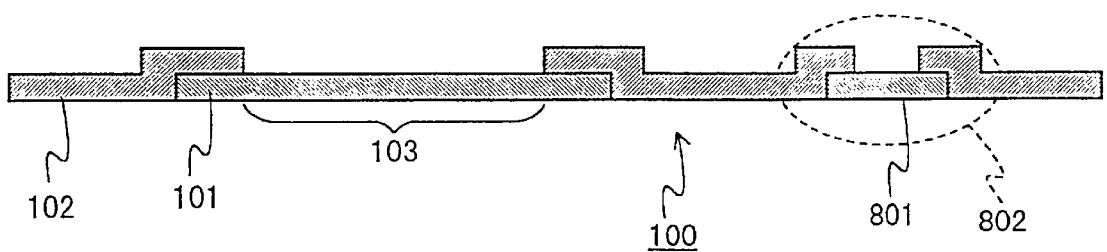
FIGS. 13A and 13B are cross-sectional views showing steps for fabricating the electrode structure shown in FIG. 12.

In fabrication, as shown in FIG. 13A, a conductive pattern 101, a surface protection layer 102 and the trimming pattern 801 are first formed on a semiconductor substrate 100. Then, an electrical test is performed to the semiconductor integrated circuit. On the basis of the result of the test, a part of the trimming pattern 801, which is exposed at the trimming pad 802, is cut off.

Figure 13B:
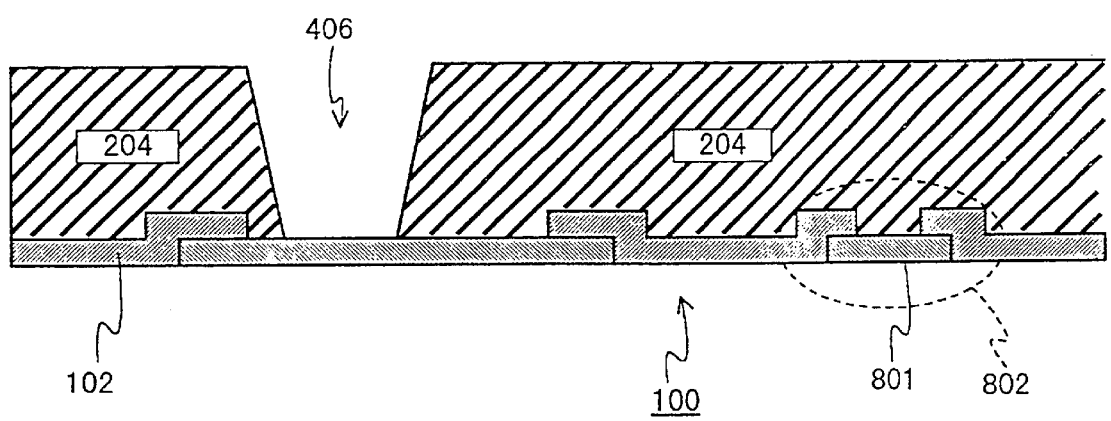

Referring to FIG. 13B, an insulating layer 204, which is of hardenable polyimide resin, is coated over the entire structure, and the opening 406 is formed through the insulating layer 204 to expose the conductive pattern 101. After the formation of the opening 406, the insulating layer 204 is hardened. The opening 406 is formed not over the trimming pad 802 so that the trimming pad 802 keeps to be protected by the insulating layer 204. After that, the processes shown in FIGS. 5B to 5D are performed.

According to the above described seventh preferred embodiment, the trimming pattern 801 of the trimming pad 802 keeps to be covered with the insulating layer 204 even after the opening 406 is formed, so that the trimming pattern 801 can keep the condition when it is just formed. In other words, the trimming pattern 801 is not affected by any processes performed after the formation thereof, especially the processes for forming a conductive layer and of patterning.

[Eighth Preferred Embodiment]

Figure 14:
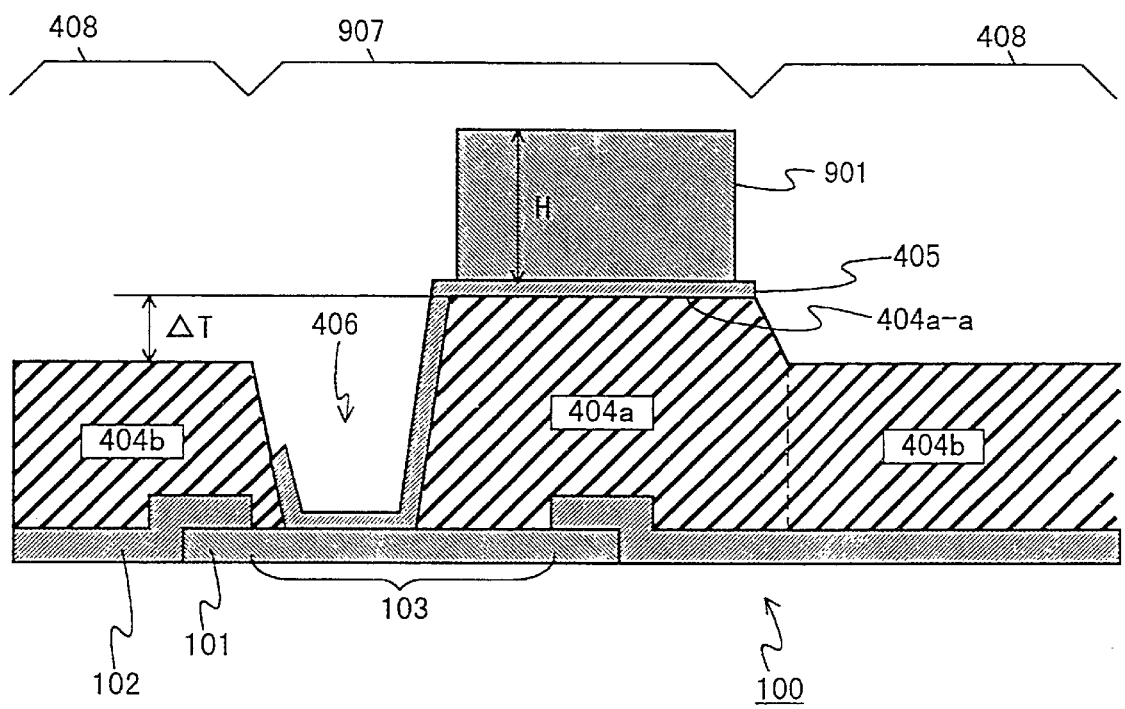
FIG. 14 is a cross-sectional view showing an electrode structure of a semiconductor apparatus, according to an eighth preferred embodiment of the invention.

FIG. 14 shows an electrode structure of a semiconductor apparatus according to an eighth preferred embodiment of the invention. In FIG. 14, the same or corresponding components to those in the first to seventh preferred embodiments are represented by the same reference numbers, and the same description is not repeated for avoiding redundant description. The electrode structure of the eighth preferred embodiment is similar to that of the second preferred embodiment. The electrode structure of the eighth preferred embodiment, however, includes a bump electrode 901 on a conductive layer 405 at a top surface 404a-a of a higher base member 404a. The bump electrode 901 may be made of metal having a high melting point, such as gold (Au) and copper (Cu), or metal having a low melting point, such as Pb—Sn and indium (In).

The higher base member 404a, the conductive layer 405, an opening 406 and the bump electrode 901 compose an electrode section 907. Lower base members 404b compose surface protecting sections 408. It is assumed that the bump electrode 901 is designed to have a height of "H," a connecting level of the electrode section 907 is "H" higher than that of the second preferred embodiment. The bump electrode 901 is usually formed after the steps shown in FIGS. 5A to 5D are completed.

Figure 15A:
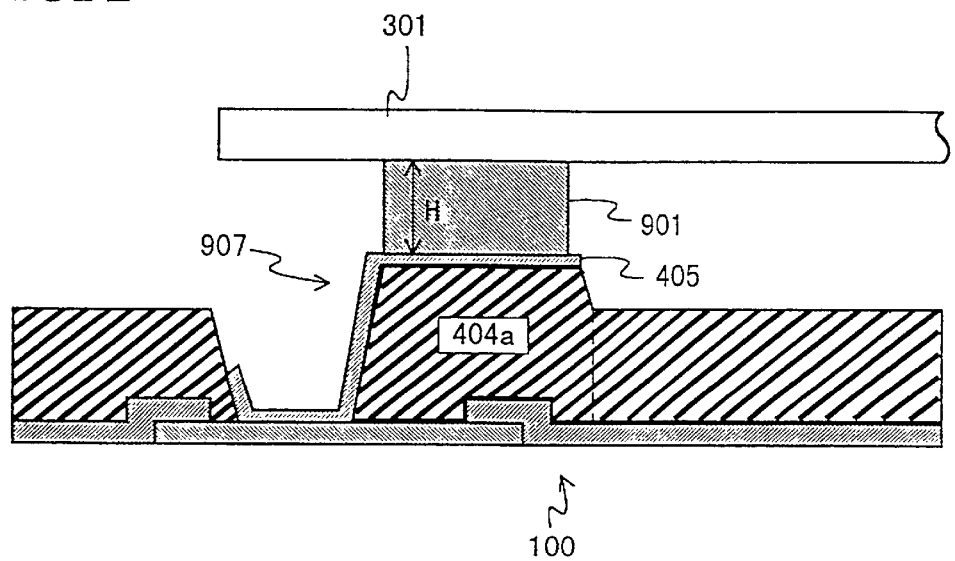
FIG. 15A is a cross-sectional view showing the positional relation between the electrode structure of the eighth preferred embodiment and a lead of a connection substrate.
Figure 15B:
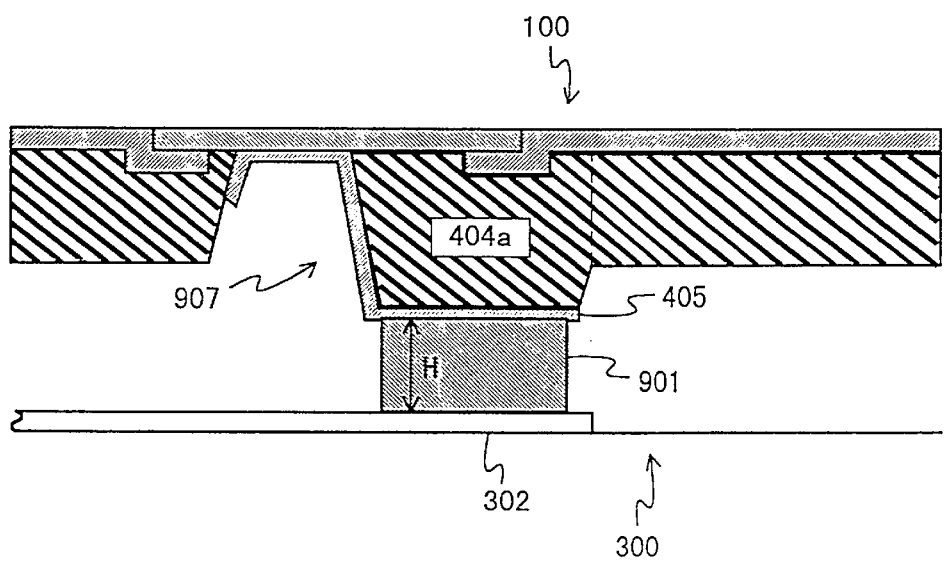
FIG. 15B is a cross-sectional view showing the positional relation between the electrode structure of the eighth preferred embodiment and a conductive wire of a connection substrate.

FIG. 15A shows the positional relation between the electrode structure of the eighth preferred embodiment and a lead 301 of a connection substrate, such as a tape carrier. FIG. 15B shows the positional relation between the electrode structure of the eighth preferred embodiment and a conductive wire 302 of a connection substrate 300. The bump electrode 901 of the electrode section 907 is bonded to the lead 301 or the conductive wire 302 by thermal-compression bonding technique, reflow technique, or the like.

According to the above described eighth preferred embodiment, the semiconductor apparatus is provided with the bump electrode 901 on the conductive layer 405 at the top surface of the higher base member 404a, so that the distance to the lead 301 or conductive wire 302 becomes wider, as compared to the electrode structure of the second preferred embodiment. As a result, a thermal stress is easily absorbed, and therefore, the semiconductor apparatus can be fabricated to have a high reliability. If the bump electrode 901 is made of solder, the electrode can be roughly connected to the connection substrate because of a self-alignment effect.

[Ninth Preferred Embodiment]

Figure 16:
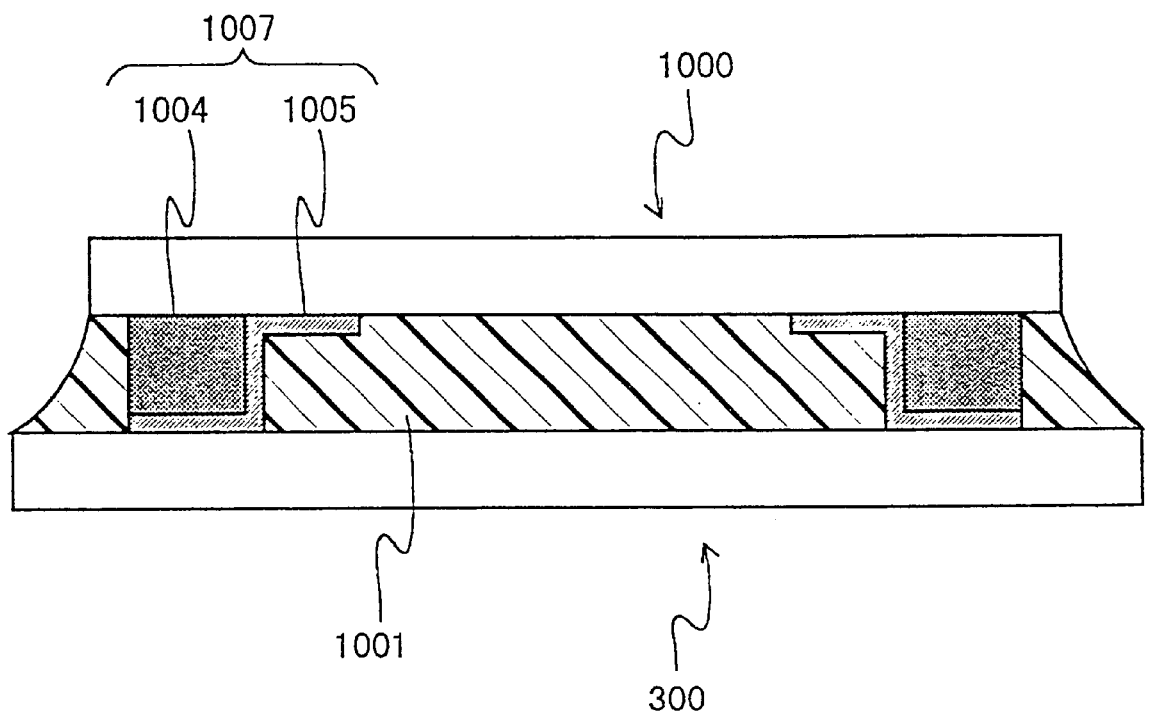
FIG. 16 is a cross-sectional view showing an electrode structure of a semiconductor apparatus, according to a ninth preferred embodiment of the invention.

FIG. 16 shows a part of a semiconductor apparatus, according to a ninth preferred embodiment of the invention. In this embodiment, a semiconductor substrate 1000 is mounted to a connection substrate 300 with a face-down mounting technique, and the space between the substrates 1000 and 300 are filled with a seal resin 1001. The seal resin 1001 maybe made of polyimide resin. The semiconductor substrate 1000 is provided with an electrode section 107, which consists of a base member 1004 and a conductive layer 1005. The base member 1004 may be made of a polyimide resin. The main feature of the embodiment is that the seal resin 1001 and the base member 1004 are made of the same material, polyimide resin.

In a conventionally semiconductor apparatus, a semiconductor substrate with a metal bump electrode is mounted to a connection substrate with the face-down technique, and the space between the substrates are filled with a seal resin. According to such a conventional semiconductor apparatus, however, a thermal stress is generated because of the difference of thermal expansion coefficients between the bump electrode and the seal resin. As a result, the bump electrode is extended with the thermal stress and may be broken due to a thermal fatigue.

In contrast, according to the ninth preferred embodiment, the seal resin 1001 and the base member 1004 are made of the same material, polyimide resin, so that the electrode section 1007 is prevented from being broken. Consequently, the apparatus according to the embodiment can be fabricated to have a high reliability.

It will be understood that the above description of the present invention is susceptible to various modifications, changes and adaptations, and the same are intended to be comprehended with the meaning and range of equivalents of the appended claims.

What is claimed is:

1. A method for fabricating a semiconductor apparatus, comprising:

providing a semiconductor integrated circuit comprising a conductive pattern:

forming an insulating layer on the semiconductor integrated circuit;

forming an opening through the insulating layer to expose a part of the conductive pattern;

forming a conductive layer over the insulating layer with the opening; removing the conductive layer except a portion extending from the exposed part of the conductive pattern to a predetermined portion of the insulating layer; and shaping the insulating layer at the portion uncovered with the conductive layer to have a height lower than the portion covered with the conductive layer wherein the conductive layer acts as a mask during the shaping step.

2. The method, according to claim 1, wherein the step for forming the opening comprises the steps of:
   (1) coating hardenable resin over the semiconductor integrated circuit to form the insulating layer;
   (2) forming the opening through the hardenable resin; and
   (3) hardening the resin.

3. The method, according to claim 1, wherein the step for forming the opening comprises the steps of:
   (1) coating photosensitive resin over the semiconductor integrated circuit to form the insulating layer; and
   (2) forming the opening through the insulating layer with lithographic technique.

4. The method, according to claim 1, wherein the step for forming the opening comprises the steps of
   (1) coating insulating resin over the semiconductor integrated circuit to form the insulating layer; and
   (2) forming the opening through the insulating layer with laser machining technique.

5. The method, according to claim 1, wherein
the step for forming the opening comprises the steps of coating insulating resin over the semiconductor integrated circuit to from the insulating layer; and
the step for shaping insulating layer is the step of plasma-etching the insulating layer.

6. The method, according to claim 1, wherein
the insulating layer is of polyimide resin.

7. The method according to claim 1, wherein
the insulating layer is formed on the semiconductor integrated circuit which is not covered with a protection layer so that the insulating layer functions as a protection layer.

8. The method, according to claim 1, further comprising the step of:
forming a bump electrode on the conductive layer, which is formed on the insulating layer.

9. The method, according to claim 1, further comprising the steps of:
performing an electrical test of the semiconductor integrated circuit; and
forming a pattern for trimming of the semiconductor integrated circuit before the steps of forming the insulating layer and forming the opening, wherein
the steps of forming the insulating layer and forming the opening are performed so that the insulating layer remains on the entire surface of the pattern for trimming.

10. A method for fabricating a semiconductor apparatus, comprising:
providing a semiconductor integrated circuit comprising a conductive pattern;
forming an insulating layer on the semiconductor integrated circuit;
forming an opening through the insulating layer to expose a part of the conductive pattern;
forming a conductive layer over the insulating layer with the opening;
removing the conductive layer except a portion extending from the exposed part of the conductive pattern to a predetermined portion of the insulating layer; and
shaping the insulating layer at the portion uncovered with the conductive layer to have a thickness thinner than the portion covered with the conductive layer wherein the conductive layer acts as a mask the shaping step.

11. The method, according to claim 10, wherein said forming of the opening comprises:
(1) coating hardenable resin over the semiconductor integrated circuit to form the insulating layer;
(2) forming the opening through the hardenable resin; and
(3) hardening the resin.

12. The method, according to claim 10, wherein said forming of the opening comprises:
(1) coating photosensitive resin over the semiconductor integrated circuit to form the insulating layer; and
(2) forming the opening through the insulating layer with lithographic technique.

13. The method, according to claim 10, wherein said forming of the opening comprises:
(1) coating insulating resin over the semiconductor integrated circuit to form the insulating layer; and
(2) forming the opening through the insulating layer with laser machining technique.

14. The method, according to claim 10, wherein
said forming of the opening comprises coating an insulating resin over the semiconductor integrated circuit to form the insulating layer; and
said shaping of the insulating layer comprises plasma-etching the insulating layer.

15. The method, according to claim 10, wherein
the insulating layer is of polyimide resin.

16. The method, according to claim 10, wherein
the insulating layer is formed on the semiconductor integrated circuit which is not covered with a protection layer so that the insulating layer functions as a protection layer.

17. The method, according to claim 10, further comprising:
forming a bump electrode on the conductive layer, which is formed on the insulating layer.

18. The method, according to claim 10, further comprising:
performing an electrical test of the semiconductor integrated circuit; and
forming a pattern for trimming of the semiconductor integrated circuit before the steps of forming the insulating layer and forming the opening, wherein
said forming of the insulating layer and said forming of the opening are performed so that the insulating layer remains on the entire surface of the pattern for trimming.

* * * * *